United States Patent [19]
Chauvel et al.

[11] Patent Number: 5,867,408
[45] Date of Patent: Feb. 2, 1999

[54] PROCESS AND DEVICE WITH DIGITAL SIGNAL PROCESSOR FOR THE IMPLEMENTATION OF A VITERBI ALGORITHM

[75] Inventors: Gerard Chauvel; Jean-Luc Villevieille, both of Antibes, France

[73] Assignee: Texas Instruments Incorporated, Dallas, Tex.

[21] Appl. No.: 942,735

[22] Filed: Oct. 2, 1997

Related U.S. Application Data

[63] Continuation of Ser. No. 420,970, Apr. 13, 1995, abandoned.

[30] Foreign Application Priority Data

Apr. 15, 1994 [FR] France ................................. 94 04548

[51] Int. Cl.[6] ............................... G06F 7/00; G06F 11/10
[52] U.S. Cl. ...................................... 364/715.06; 371/43.7
[58] Field of Search ....................... 364/715.011, 715.06, 364/736; 375/341, 262; 371/43

[56] References Cited

U.S. PATENT DOCUMENTS

| | | | |
|---|---|---|---|
| 4,606,027 | 8/1986 | Otani ........................................... | 371/43 |
| 4,614,933 | 9/1986 | Yamashita et al. ........................ | 341/51 |
| 5,150,369 | 9/1992 | Costa et al. ................................ | 371/43 |
| 5,331,664 | 7/1994 | Desperben et al. ....................... | 375/341 |
| 5,465,275 | 11/1995 | Blaker et al. ............................. | 375/341 |
| 5,544,177 | 8/1996 | Ishida ........................................ | 371/43 |

FOREIGN PATENT DOCUMENTS

WO A 93
19418  9/1993  WIPO .

OTHER PUBLICATIONS

IEEE Transactions on Communications, vol. 41, No. 4, Apr. 1993, New York US, pp. 636–644, XP372705, C.B. Shung/H, –D, Lin/R. Cypher/P.H. Siegel/H.K. Thapar: 'Area–Efficient Architectures for the Viterbi–Algorithm—Part I: Theory.'

Patent Abstracts of Japan, vol. 10, No. 11 (E–374) Jan. 17, 1986 & JP–A–60 173 930 (Fujitsu KK) Sep. 7, 1985.

Patent Abstracts of Japan, vol. 11, No. 359 (E–559) Nov. 21, 1987 & JP–A–62 135 018 (Fujitsu Ltd) Jun. 18, 1987.

IEEE Journal on Selected Areas in Communication., vol. 6, No. 3, Apr. 1988, New York US pp. 527–537, P.G. Gulak/T. Kailah: 'Locally Connected VLSI Architectures for the Viterbi Algorithm.'

IEEE Communications Magazine, vol. 29, No. 5, May 1991, Piscataway, NJ US pp. 46–55, XP231084, G. Fettweis/H. Meyr: 'High–Speed Parallel Viterbi Decoding: Algorithm and VLSI–Architecture.'

*Primary Examiner*—Chuong Dinh Ngo
*Attorney, Agent, or Firm*—Gerald E. Laws; William B. Kempler; Richard L. Donaldson

[57] ABSTRACT

This devise comprising a digital signal processor (1) proper, a ROM program memory (2) and a RAM data memory (3) which are connected respectively to the processor, is characterized in that associated with the RAM data memory is a RAM viterbi memory (7) including means for executing addition, comparison and selection operations of the Viterbi algorithm, and logic (8) for controlling the Viterbi memory (7).

4 Claims, 5 Drawing Sheets

PROCESS AND DEVICE WITH DIGITAL SIGNAL PROCESSOR FOR THE IMPLEMENTATION OF A VITERBI ALGORITHM

This application is a Continuation of application Ser. No. 08/420,970 filed Apr. 13, 1995 now abandoned.

The present invention relates to memories involved in the construction of digital signal processors or DSPs and refers more particularly to RAM Viterbi memories.

Generally, the function of a DSP is to perform operations with high computational accuracy, for example greater than or equal to 32 bits.

The three obstacles which limit the performance of a processor in its work of addition, comparison and selection within the Viterbi algorithm are:
- arithmetic computation
- data transfer
- delay in respect of the execution of conditional instructions.

The Viterbi algorithm can be divided into three procedures: procedure I transforms and loads the sample data from an interface to a RAM data memory, procedure II computes the "metrics" or tables of values each of which represent the difference between an observed value and various possible values for each sample and generates the trace or determination of the data string having the maximum likelihood and procedure III generates the data from the trace memory.

Procedure II requires a set of simple operations such as: addition, subtraction, comparison and data transfer for each input sample. A large number of cycles of the DSP is required in order to execute this algorithm by virtue of the fact that the structure of the DSP is not tailored.

The invention aims to remedy this drawback by creating a memory which is specially designed to be associated with a digital signal processor within the context of the execution of the Viterbi algorithm.

Its subject is therefore a process for implementing a Viterbi algorithm, for addition, comparison, selection making it possible to reduce the bandwidth of a RAM memory, characterized in that it consists in the course of a cycle n, in carrying out on the basis of an old metric Me(2j) or table of values representing the difference between an observed value and various possible values computations of expressions Me(2j)+do and Me(2j)−do, in storing the partial results in two temporary registers and in the course of a next cycle n+1, in computing on the basis of another old metric Me(2j+1), the expressions Me(2j+1)+d1 and Me(2j+1)−d1, do and d1 being the discrepancies between the theoretical values of coefficients and the actual values of samples, and in comparing the results obtained with the contents of the temporary registers in order to define two new tables of values Ms(j), Ms(j+8) and the transition decision in respect of the path towards states Ts(j), Ts(j+8) representing the result of the comparison.

The subject of the invention is also a device with digital signal processor for the implementation of the process defined above, comprising a digital signal processor proper, a ROM program memory and a RAM data memory which are connected respectively to the processor, characterized in that associated with the RAM data memory is a RAM Viterbi memory including means for executing addition, comparison and selection operations of the Viterbi algorithm, and logic for controlling the RAM Viterbi memory.

The invention will be better understood on reading the description which follows, offered merely by way of example and given with reference to the attached drawings in which.

Figure 1:
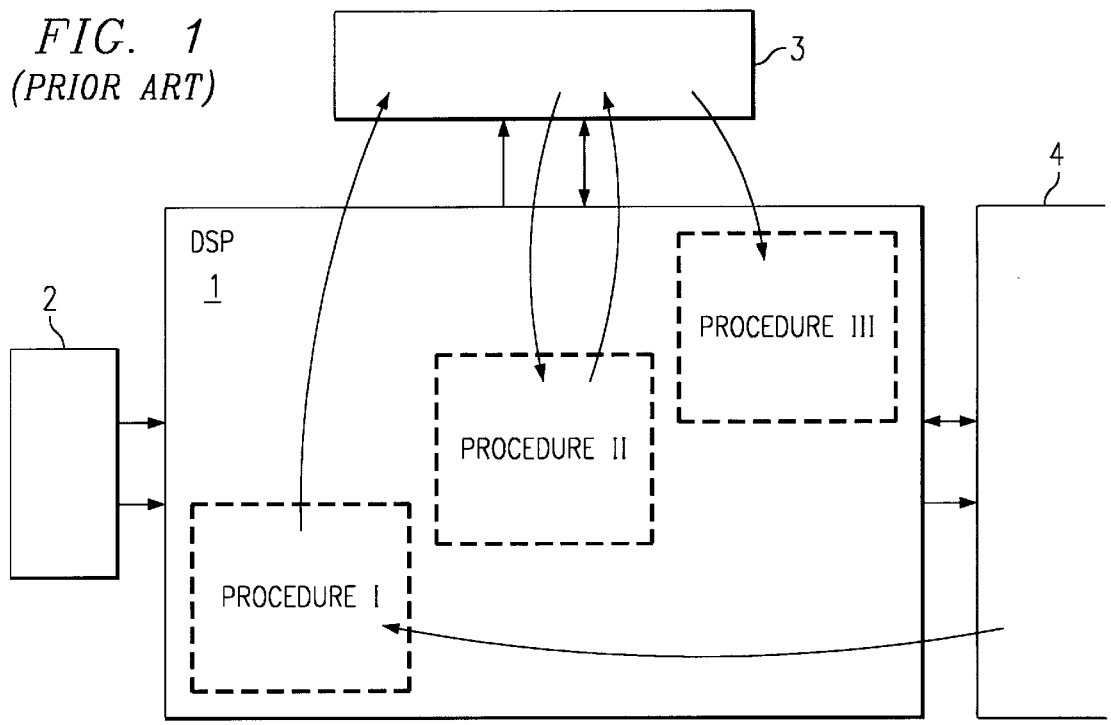
FIG. 1 is a schematic diagram of a conventional digital signal processor executing an addition, comparison and selection procedure.

The conventional digital signal processor represented in FIG. 1 includes a processor proper or core of the digital signal processor 1 to which are linked a ROM program memory 2, a RAM data memory 3 and an interface circuit.

As indicated by the dashed rectangles contained within the core 1 of the processor and the arrows, the processor, when it executes a Viterbi algorithm, carries out the operation as three procedures:

- in the course of procedure I, data originating from the interface circuit 4 are acquired, and these data are transformed and transferred to the RAM data memory 3;

- in the course of procedure II, the data are transferred from the RAM 3 to the core 1 of the processor, the metrics or tables of values are computed, these representing the difference between an observed value and the various possible values, for each data sample, traces or data strings having the maximum likelihood are calculated and the results are stored anew in the RAM 3;

- in the course of procedure III, data are produced from the trace data stored in the RAM memory 3.

Figure 2:
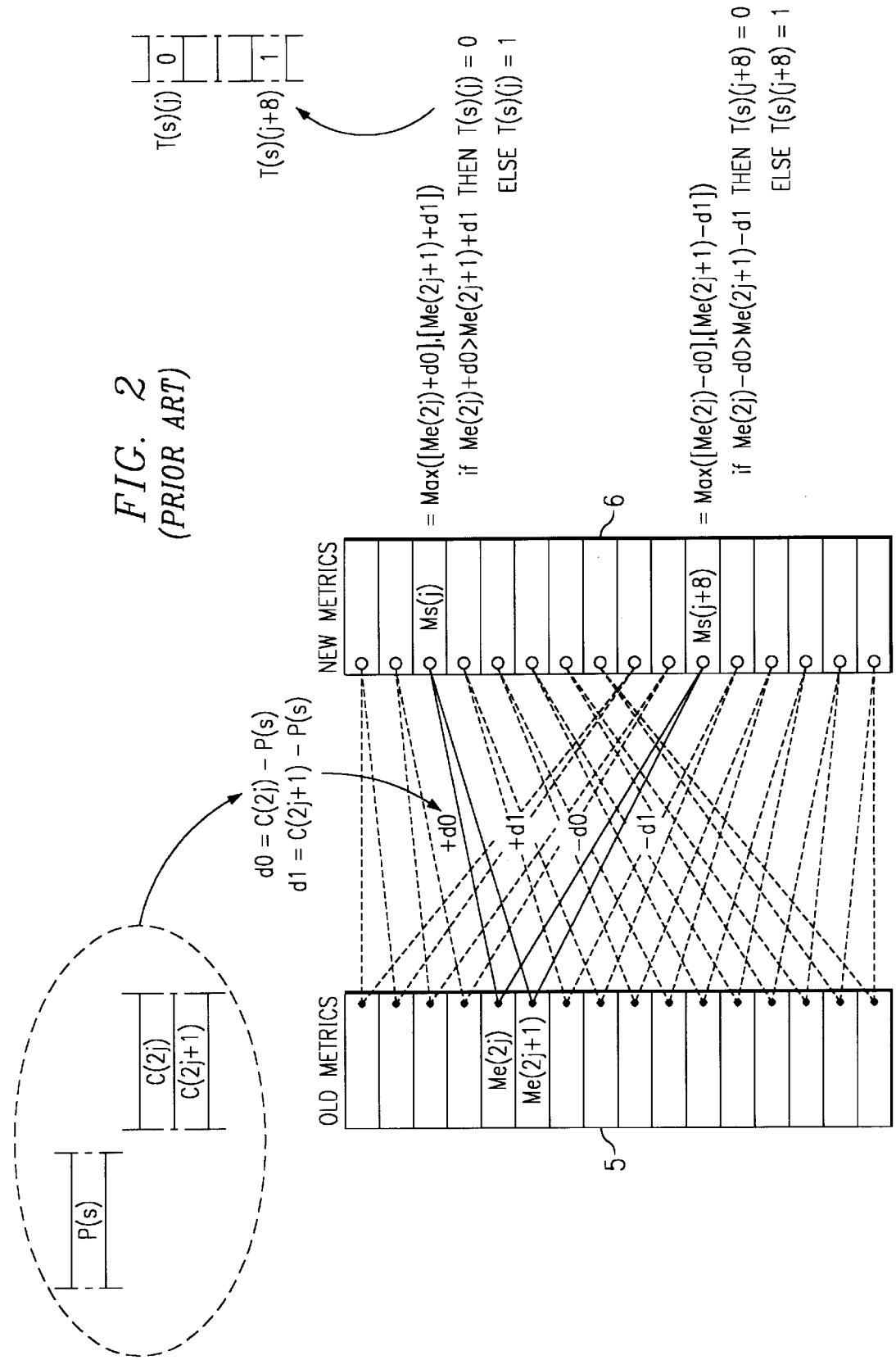
FIG. 2 is a diagram representing an ACS 16-state Viterbi equalizer.

The aforesaid operations are illustrated by the diagram of FIG. 2 in which is represented a Table 5 of old values stored in the RAM memory 3 of the circuit of FIG. 1 and a Table 6 of new values resulting from the adding, comparing and selecting of the old values by the core of the processor 1.

The old and new metrics are designated by the labels Me and Ms respectively.

The operations carried out on the old metrics and the results obtained placed in the table of new metrics 6 are portrayed by lines connecting each box of the Table 5 of old metrics to two boxes of the Table 6 of new metrics.

These lines are represented broken with the exception of the lines connecting the metric Me(2j) of Table 5 to the metrics Ms(j) and Ms(j+8) of Table 6 and the metric Me(2j+1) of Table 5 to the metrics Ms(j) and M1(j+8) of Table 6.

do=C(2j)−P(s) is added and deducted in the course of the operations on Me(2j).

d1=C(2j+1)−P(s) is added and deducted in the course of the operations on Me(2j+1).

In these relations C(2j), C2(j+1) are coefficients and P(s) are samples contained in the RAM memory 3.

The addition, comparison and selection part of the 16-state Viterbi equalizer algorithm applied for example to a GSM cellular radio telephony system (FIGS. 3 and 4) illustrates the architecture of the Viterbi RAM. Coefficients "C" and input samples "P" are generated by procedure I.

For each sample P(s), procedure II computes sixteen new metrics "Ms" from the previous metric "Me". To reduce the bandwidth of the memory in general two metrics Ms(j) and Ms(j+8) are computed in parallel.

The following parameters come into these computations.

| | | |
|---|---|---|
| C | = | inter-symbol distortion coefficients |
| D0, D1 | = | discrepancy between the theoretical value of a coefficient and the actual value of a sample |
| P | = | probabilities of bits transmitted |
| Me | = | old metric |
| Ms | = | new metric |
| T | = | transition decision in respect of the path towards state $j$ | loop s = 1,120 loop j = 0,7

D0 = C2j − Pj   D1 = C2j + 1 − Pj

If Me 2j + Do > Me2j + 1 + D1 then Msj = Me2 + D0   Ts, j = 0 else Msj = Me2j + 1 + D1   Ts, j = 1 endif

If Me2j − D0 > Me2j + 1 − D1 then Msj + 8 = Me2j − D0,   Ts,j + 8 = 0 else Msj + 8 = Me2j + 1 − D1,   Ts, j + 8 = 1 endif end loop

The value of a new metric Ms is the maximum of two expressions: Me2j+/−D0>Me2j+1+/−D1. The result of the comparison generates the decision path towards the state T(s) (j) or T(s) (j+8) which is stored inside the memory T for subsequent use by procedure III.

Such paths are represented in FIG. 2 where it is seen that for one sample, sixteen computations are performed with different coefficients.

Figure 3:
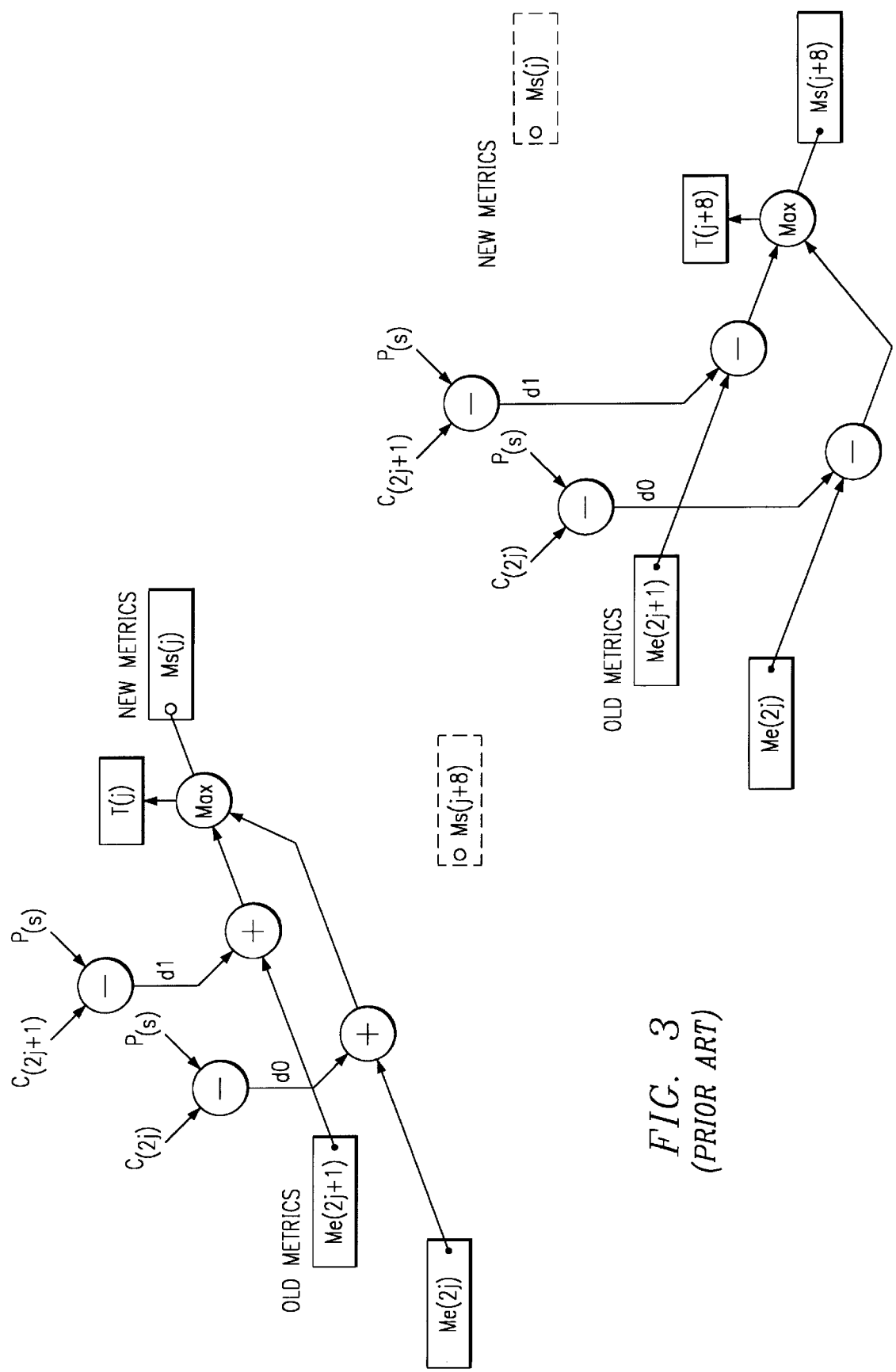
FIG. 3 shows two cycles for computing metrics of the diagram of FIG. 2.

The alteration in the addition, comparison and selection signal in progress is represented in FIG. 3.

In the course of cycle n, the new metric Ms(j) and the transition path T(j) are computed on the basis of the old metrics Me(2j) and Me(2j+1). The operation consists in selecting the maximum of two 16-bit operations between Me(2j), C(2j), P(s) and Me(2j+1), C(2j+1), P(s). Computation of Ms(j+8) and T(s) (j+8), in cycle n+1, is symmetric. Two 16-bit "+" operations are replaced by "−" operations.

Cycles n and n+1 require four accesses to the memory of old metrics. In general, two separate memories Me(2j) and Me(2j+1) are used to improve the bandwidth of the memory and to reduce the number of cycles of execution of the algorithm for addition, comparison and selection A.C.S.

The running of a metric computation in progress is illustrated in FIG. 3 where all the factors coming into the computation are marked.

Figure 4:
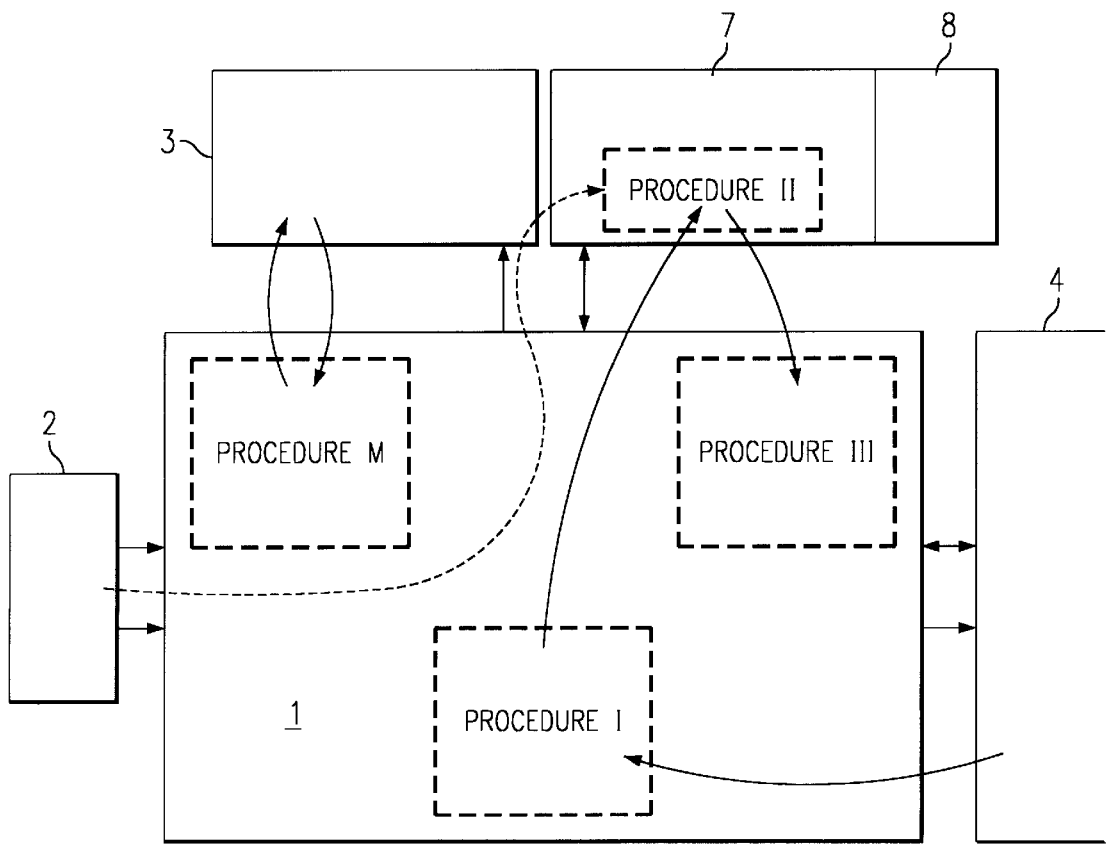
FIG. 4 is a schematic diagram of a digital signal processor provided with a RAM Viterbi memory according to the invention.

A digital signal processor provided with a RAM Viterbi memory according to the invention is represented in FIG. 4.

Like the processor of FIG. 1, it includes a processor 1 proper to which are linked a ROM program memory 2, a RAM data memory 3 and an interface circuit 4.

The processor according to the invention furthermore includes a RAM Viterbi memory 7 which is separate from the RAM memory 3 and is linked to the processor 1 and with which is associated logic 8 for controlling execution of procedure II for addition, comparison and selection which is now allocated to the RAM Viterbi memory.

Procedures I and III are still allocated to the core of the processor 1 to which is allocated moreover a procedure n relating to another program.

The RAM Viterbi memory 7 is seen as a memory both from the digital signal processor and in respect of procedure II for addition, comparison and selection.

The processor 1 uses the Viterbi RAM 7 as work memory. At the end of execution of procedure I, the samples are available for the addition, comparison and selection processing without data transfer to memory.

The digital signal processor I is not assigned by the execution procedure II and the processor 1 and the RAM Viterbi memory 7 under the control of its logic 8 can operate in parallel.

Figure 5:
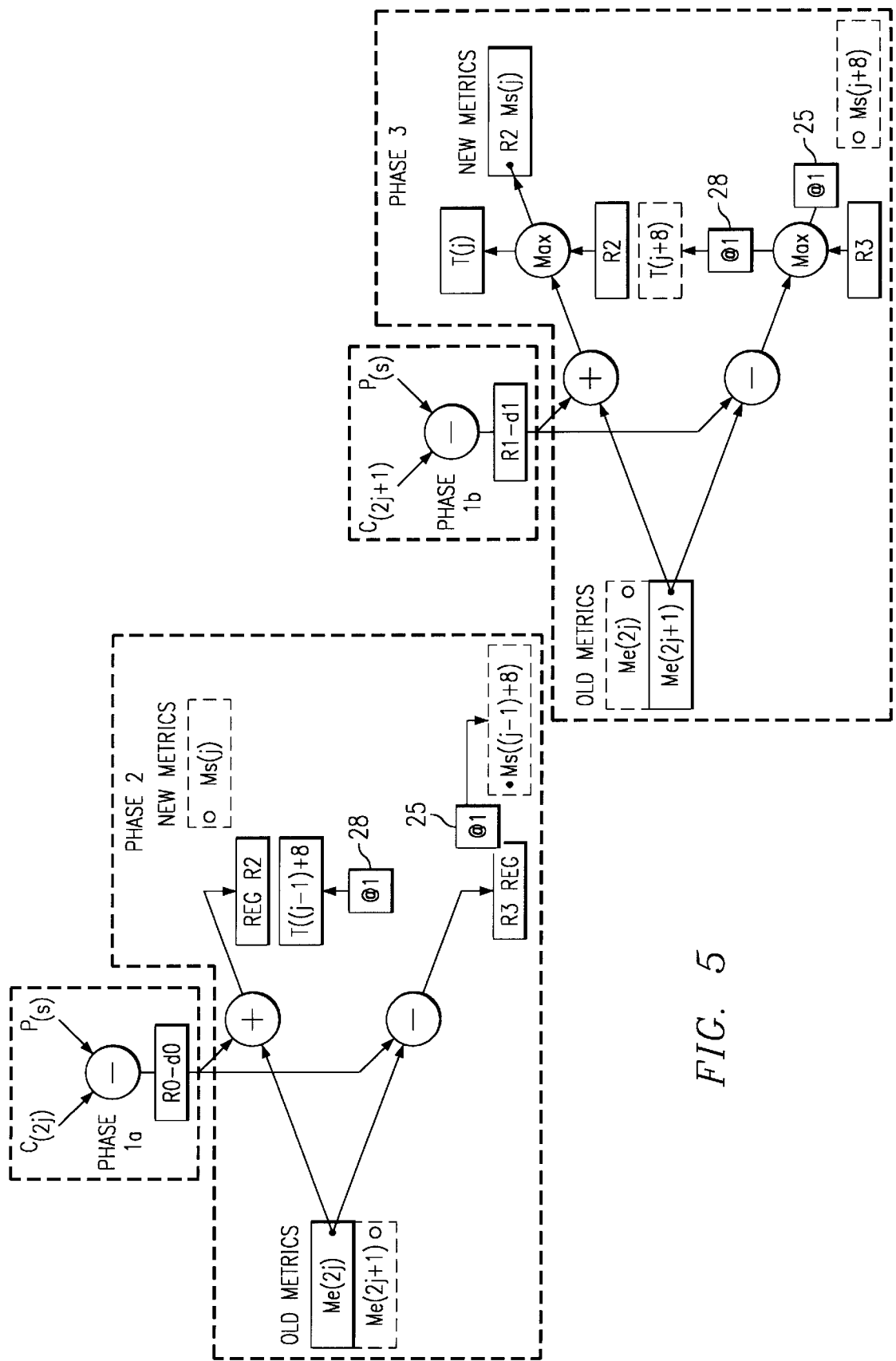
FIG. 5 shows two cycles for computing metrics with the aid of the processor of FIG. 4.

The sketch of the alteration of the new addition comparison and selection signal is represented in the sketch of FIG. 5.

It is seen in this figure in which all the phases of the computational procedure are designated by references, that the implementation of the ACS addition, comparison and selection algorithm requires only one memory cycle to read the old metric in each cycle. The discrepancy between the theoretical values and the actual value "do" and "d1" can be calculated every second time.

During cycle n, the result of Me(2j)+d0 and Me(2j)−d0 are stored inside a temporary register. In the course of cycle n+1, Me(2j+1)+d1 and Me(2j+1)−d1 are computed and compared with the contents of the temporary registers. The maximum Ms(j) is stored in a new metric memory and a transition path T (s) (j) is stored in a memory "T". A pipeline state is introduced before storing the result of Ms(j+8) and T(s)(j+8) in the corresponding memories.

The architecture of the Viterbi RAM according to the invention will now be described with reference to FIG. 6.

The Viterbi RAM 7 includes logic 8 for controlling execution of the aforesaid procedure II, which is connected to a circuit 9 generating write addresses and for memory writing which is itself connected to a counter (s) 10 and to a counter (j) 11.

The logic 8 includes an initializing input INIT. The address generating circuit 9 is linked to a 16×16 RAM memory 12.

The Viterbi RAM memory furthermore includes multiplexers 13 to 16 grouped in pairs, the outputs of the multiplexers 13 and 14 on the one hand, and 15 and 16 on the other hand, being linked respectively to the inputs A and B of two arithmetic and logic units 17, 18 whose outputs are in turn linked to registers R0 and R1, 19, 20.

Registers R2 and R3, 21, 22 with which are associated comparators 23, 24 for establishing the maximum values are also linked to the control logic 6. The outputs of the arithmetic and logic units 17 and 18 are also linked to inputs of the comparators 23 and 24.

They deliver signals to the RAM memory 12.

Furthermore, a pipeline register 25 is associated with the register R3 22.

Linked circuits 26, 27, 28 for control and storage of the comparison result are associated with the registers 21, 22, 25, the circuits 26 and 27 are linked to the logic 8 and to the comparators 23, 24 respectively.

Figure 6:
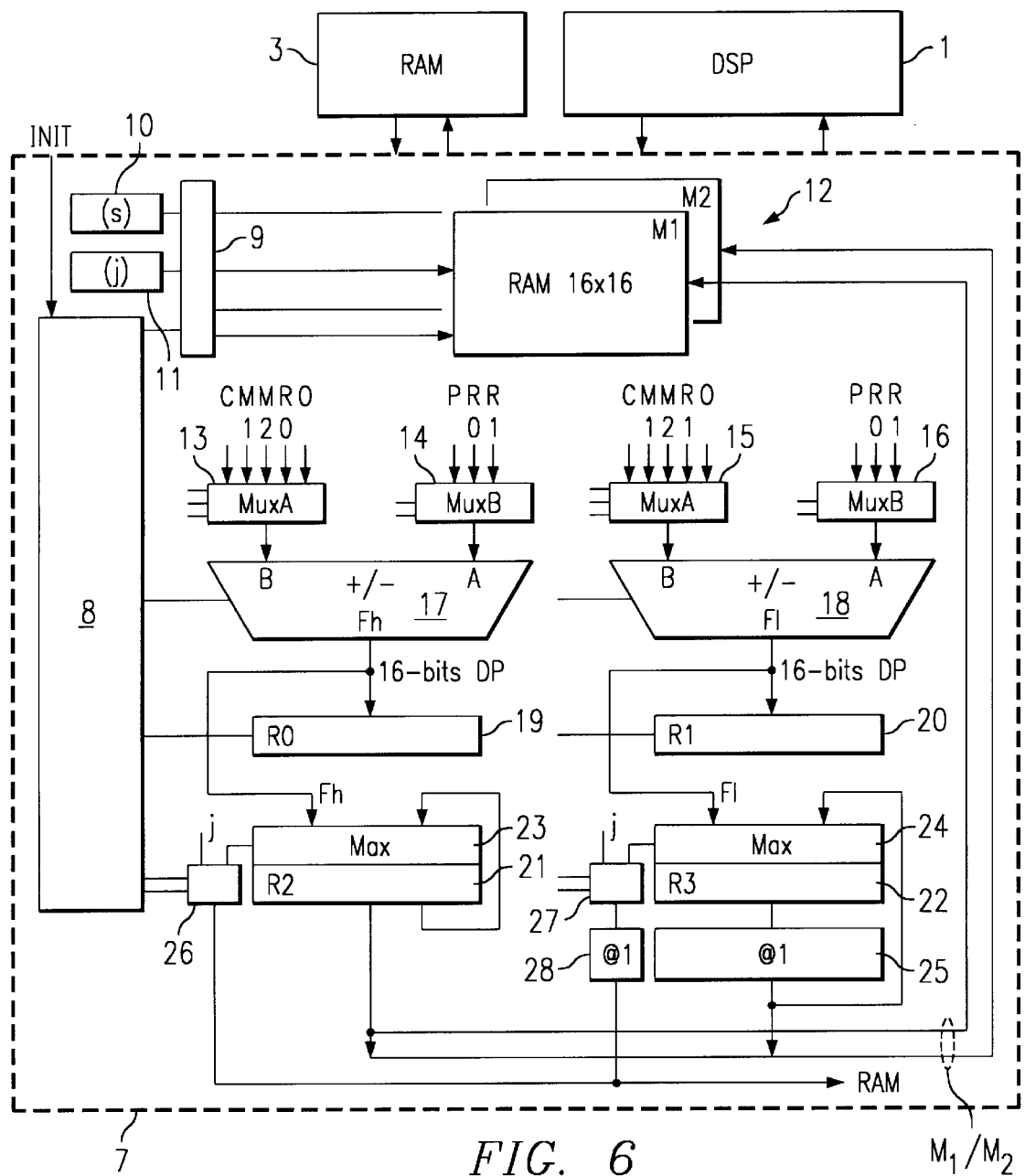
FIG. 6 is a schematic diagram showing the architecture of the Viterbi RAM according to the invention.

According to the example, implementation of the algorithm represented in FIG. 6, the Viterbi RAM contains two data paths in order to compute Ms(j) and Ms(j+8) in parallel. In the course of phase 1, the discrepancies D0 and D1 are computed and the result stored respectively in the registers R0 and R1, 19 and 20. In the course of phase 2, the partial result is computed on the basis of Me(2j) and the results are placed in registers R2 and R3, 21 and 22. In the course of phase 3, the maximum which is required to be stored in the new metric memory 12 is computed.

Ms(j) and T(s) (j) are stored in the new metric memories and T at the end of phase 3 in the RAM 3. Ms(j+8) and T(s) (j+8) are delayed by one phase on traversing the pipeline registers 25 and 28 before storage in memory.

ACS execution begins on the INIT signal under the supervision of the processor 1. It is controlled by the counters (s), (j), 10 and 11 and the control logic block 8.

Execution of the algorithm is detailed below.

Phase 1a: the discrepancies do=C2j−Ps are computed and the result stored in the register Ro 19.

Phase 1b: the discrepancies d1=C2j+1−Ps are computed and the result stored in the register R1 20.

Phase 2: the expressions Me(2j)+do and Me(2j)−do are computed in parallel and the results are transferred to the registers R2 and R3 21 and 22.

Ms((j−1)+8) and Ts((j−1)+8) for freeing the previous loop are stored on the basis of the pipeline register 25 in their respective memories.

Phase 3: the expressions Me(2j+1)+do and Me(2j+1)−d1 are computed in parallel. The results are compared respectively with the contents of the registers R2 and R3, 21 and 22.

The maximum of Me(2j+1)−do and of the content of the register R2 21 is stored in Ms(j) and the state of the comparisons in Ts(j).

The maximum of Me(2j+1)−d1 and of the content of the register R3 22 and the state of the comparison T(s)(j+8) is stored in the pipeline register 25 and 28, respectively.

Phases 1 to 3 are repeated 8×120 times.

The operations just described are presented below.

Loop s = 1,120 No. of internal cycles 120 × (3 × 8) = 2880

Loop j = 0, 7

1 RO = C(2j) − Ps   R1 = C(2j + 1) − P(s)

2 R2 = (Me(2j) + RO)   R3 = (Me(2j) − RO)

3 R2 = max[(R2), (Me(2j + 1) + R1)]   R3 = max[(R3), (Me(2j + 1) − R1)]

T(s, j),Ms(j) = R2 {@1}T(s, j + 8), Ms(j + 8) = R3

End loop

End loop

We claim:

1. A method of operating a digital signal processor to implement a Viterbi algorithm comprising the following steps:

receiving data from an interface circuit;

calculating from an old metric Me(2j) the expressions Me(2j)+do and Me(2j)−do simultaneously in a first arithmetic unit and a second arithmetic unit by simultaneously accessing a single storage location which contains the old metric Me(2j);

storing the results of calculating the expressions Me(2j)+do by the first arithmetic unit in a first register while simultaneously storing the results of calculating the expressions Me(2J)−do by the second arithmetic unit in a second register;

calculating from an old metric Me(2j+1) the expressions Me(2j+1)+d1 and Me(2j+1)−d1 simultaneously in the first arithmetic unit and the second arithmetic unit by simultaneously accessing a single storage location which contains old metric Me(2j+1), where do and d1 are the discrepancies between theoretical values of coefficients and actual values of samples;

comparing the value of the expression Me(2j+1)+d1 to the value stored in the first register to form a new metric Ms(j) while simultaneously comparing the value of the expression Me(2j+i)−d1 to the value stored in the second register to form a new metric Ms(j+8): and storing the new metric Ms(j) and the new metric Ms(j+8) in a memory.

2. Process according to claim 1, characterized in that it consists in computing the discrepancy do=C(2j)−Ps between the theoretical values of coefficients and the actual values of samples once only using either the first or the second arithmetic unit and computing the discrepancy d1=C(2j+1)−Ps only once using the either the first or the second arithmetic unit, where C=inter-symbol distortion coefficients P=probability of bits transmitted.

3. Process according to claim 1, characterized in that the value of the new metric Ms(j) is stored during a first phase of operation.

4. Process according to claim 1, characterized in that storage of the value of new metric Ms(j+8) is delayed by a second phase of operation with the aid of a pipeline register (25).

* * * * *